(12) United States Patent
Tanida et al.

(10) Patent No.: US 7,812,619 B2
(45) Date of Patent: Oct. 12, 2010

(54) CAPACITANCE MEASURING APPARATUS AND CAPACITANCE MEASURING METHOD

(75) Inventors: Shinichi Tanida, Tokyo (JP); Hiroshi Nada, Tokyo (JP); Tomoe Ikawa, Tokyo (JP)

(73) Assignee: Agilent Technologies, Inc., Santa Clara, CA (US)

( * ) Notice: Subject to any disclaimer, the term of this patent is extended or adjusted under 35 U.S.C. 154(b) by 382 days.

(21) Appl. No.: 11/891,105

(22) Filed: Aug. 9, 2007

(65) Prior Publication Data
US 2008/0068029 A1 Mar. 20, 2008

(30) Foreign Application Priority Data
Sep. 15, 2006 (JP) .............................. 2006-250872

(51) Int. Cl.
*G01R 27/26* (2006.01)
*G06G 7/12* (2006.01)
(52) U.S. Cl. ..................... 324/658; 324/686; 327/362
(58) Field of Classification Search ................ 324/658, 324/686; 327/362, 363, 378
See application file for complete search history.

(56) References Cited

U.S. PATENT DOCUMENTS

| 5,014,011 | A | * | 5/1991 | Colvin ...................... 324/663 |
| 5,321,363 | A | * | 6/1994 | Wakamatsu et al. ......... 324/523 |
| 5,321,367 | A | * | 6/1994 | Koscica et al. .............. 324/663 |
| 6,242,966 | B1 | * | 6/2001 | Shiotsuka ................... 327/362 |
| 6,683,462 | B2 | * | 1/2004 | Shimizu ..................... 324/658 |
| 6,731,129 | B1 | * | 5/2004 | Belluomini et al. ......... 324/765 |

FOREIGN PATENT DOCUMENTS

JP  2002-168893  6/2002

OTHER PUBLICATIONS

Agilent Technologies Evaluation of Gate Oxides Using a Voltage Step Quasi-Static CV Method, Application Note 4156-10, 15 pps.

* cited by examiner

*Primary Examiner*—Timothy J Dole
*Assistant Examiner*—Farhana Hoque

(57) ABSTRACT

A capacitance measuring apparatus which comprises: a voltage source for applying voltage fluctuation to a device under test; a current source for absorbing the current flowing through the resistance component of the device under test; and an ammeter for measuring the leakage current flowing through the device under test before and after voltage fluctuation and the charging current flowing through the device under test as a result of voltage fluctuation.

9 Claims, 10 Drawing Sheets

CAPACITANCE MEASURING APPARATUS AND CAPACITANCE MEASURING METHOD

BACKGROUND

1. Field of the Disclosure

The present invention relates to a capacitance measuring apparatus and capacitance measuring method that are used for quasi-static capacitance measurement of a capacitance element in the development of semiconductor devices and semiconductor processes.

2. Discussion of the Background Art

The capacitance of a device under test (DUT) is measured as part of the evaluation that is performed in the development of semiconductor devices and semiconductor processes. The capacitance measurement of a device under test generally is a capacitance measurement at high frequency or a capacitance measurement at low frequency (quasi-static capacitance measurement). As a result of semiconductor processes being conducted on micro/nano levels in recent years, the measured capacitance at a low frequency has become smaller, and there is a need for technology with which high-precision measurement is possible.

The step voltage method is a means for measuring the amount of change in the charging charge that is produced when the voltage applied to a device under test is changed, and then finding the capacitance value of the device under test from the amount of change in this charging charge and the amount of change in the applied voltage. JP Unexamined Patent Publication (Kokai) 2002-168,893, for instance, discloses technology relating to the step voltage method.

However, there is a problem with the micro/nano-level processing of semiconductors in that in the case of a capacitance measurement at low frequency in particular, a large leakage current attributed to the resistance component of the device under test flows into the ammeter for measuring the charging current flowing to the device under test, and this leads to errors in the capacitance measurement. FIG. 10 shows an example of the effect of this leakage current. When the voltage applied to the device under test is changed, charging current flows to the device under test and the charging charge changes (surface area of current (I) graph in FIG. 10). If there is no leakage current, the only current flowing into the ammeter will be charging current that is flowing through the device under test, but when leakage current is generated, in addition to the charging current flowing through the device under test, leakage current flows into the ammeter. As a result, it is not possible to correctly measure the amount of change in the charging charge of the device under test. There is therefore a need for a capacitance measuring method with which it is possible to correct for the charge of this leakage current component. The following is a conventional example of a capacitance measuring method with which it is possible to correct for the leakage current component.

The relationship between capacitance C of the device under test (units F), charging charge Q (units C), and applied voltage V (units V) is represented by the following formula:

$$Q = CV \quad (1)$$

Assuming that capacitance C of the device under test is constant, when voltage V applied to the device under test is changed from a certain $V_{set1}$ to a different voltage $V_{set2}$, the charging charge of the DUT also changes from a certain value $Q_1$ to a different value $Q_2$. In essence, the charging charge changes by $\Delta Q$ ($= Q_2 - Q_1$). The amount of change $\Delta Q$ in the charging charge is found by the integration of charging current I as shown in the following formula.

$$\Delta Q = \int I dt \quad (2)$$

FIG. 11 is a drawing showing an example of a case in which the amount of change $\Delta Q$ in the charging charge when applied voltage has been changed is found by a rectangular approximation by period $\Delta t_{PLC}$ defined as a predetermined integer multiple of the PLC (power line cycle). When the frequency of the power source voltage is 50 Hz, $\Delta t_{PLC}$ is, for instance, 20 ms and when the frequency of the power source voltage is 60 Hz, it is, for instance, 16.67 ms. In this case, the amount of change $\Delta Q$ in the charging charge is approximately represented by the following formula:

$$\Delta Q \approx \Sigma I_k * \Delta t_{PLC} \quad (3)$$

where $k = 1, 2, \ldots, T_{cinteg}/\Delta t_{PLC}$. $T_{cinteg}$ is the integration period of the charging current.

FIG. 14 is a block diagram for measurement by the conventional step voltage method; the output of a variable voltage source 82 is connected to one terminal of a device under test (DUT) 81, and the other end of a device under test 81 is connected to a ground terminal via an ammeter 84. On the other hand, a voltmeter 83 is connected to the output of variable voltage source 82. FIG. 12 is a drawing showing the measurement sequence of the conventional step voltage measurement, and shows the change in the applied voltage of one measurement step. It should be noted that a first measuring unit is used for variable voltage source 82 and voltmeter 83, and a second measuring unit is used for ammeter 84. First, the value of the applied voltage is set at a certain value $V_{set1}$ by the first measuring unit. When time delay1, which has been predetermined from the applied voltage setting, has lapsed, applied voltage $V_1$ is measured by the first measuring unit, and then the leakage current $I_{L1}$ is measured by the second measuring unit, which is an ammeter. The measurement of applied voltage $V_1$ and the measurement of leakage current $I_{L1}$ are preformed in succession in this way because a single A/D converter is shared by the first measuring unit and the second measuring unit. Once applied voltage $V_1$ has been measured, the measurement of charging current by the second measuring unit is initiated and the applied voltage setting is changed to a different setting $V_{set2}$. The applied voltage is thereby increased.

The measurement of the charging current by the second measuring unit involves repeating $T_{cinteg}/\Delta t_{PLC}$ times in $\Delta t_{PLC}$ intervals and then finding the integral as the amount of change in the charging charge $\Delta Q_{total}$. Once measurement of the charging charge is complete, the applied voltage $V_2$ is measured by the voltage source and then the leakage current $I_{L2}$ is measured by the second measuring unit.

The capacitance value C is found using the following formulas:

$$C = \Delta Q / \Delta V = (\Delta Q_{total} - \Delta Q_{Leak} + Q_{correction})/(V_2 - V_1) \quad (4)$$
$$= \{(\Sigma I_k * \Delta t_{PLC}) - \Delta Q_{Leak} + Q_{correction}\}/(V_2 - V_1) \quad (5)$$

Here, $\Delta Q_{Leak}$ is the amount of change in the charging charge due to leakage current. This is found by the following formula using trapezoid approximation, based on the assumption that the charging charge increases linearly over time as shown in FIG. 13.

$$\Delta Q_{Leak} = 1/2(I_{L1} - I_{L2})\tau + I_{L2}(T_{cinteg} - \tau) \quad (6)$$

Here, $\tau$ is the time for which the device under test is charged, and this time is determined as described below.

By means of this measurement, the status of the second measuring unit is monitored at the same time that the second measuring unit measures the charging current every $\Delta t_{PLC}$, and if the output voltage and the voltage setting are not the same, the device under test is being charged. Charging is completed at the time when the output voltage and voltage setting become the same (this state is referred to as the Vloop state hereafter).

It should be noted that the charging current is measured every $\Delta t_{PLC}$ period and that the status of the second measuring unit is monitored in order to cancel the effect of power line noise.

$Q_{correction}$ in formula (4) is the charge that is used to charge to the capacitance connected in parallel to the range resistance inside the second measuring unit.

When the measurement of leakage current $I_{L2}$ by the second measuring unit is completed, a specific time delay2 is allowed to lapse and then the next step is started, in essence, the voltage setting is raised, and the same measurement is performed.

Nevertheless, by means of the above-mentioned conventional method for measuring capacitance there is a problem in that when the leakage current becomes much larger than the charging current, the leakage current accounts for more of the current flowing through the ammeter than does the charging current, the charging current becomes a small part of the ammeter measuring range, and there is a reduction in the timing range and the S/N (signal-to-noise ratio).

SUMMARY OF THE DISCLOSURE

The present invention is created in light of the above-mentioned problems, an object thereof being to provide a capacitance measuring apparatus and a capacitance measuring method with which it is possible to measure capacitance with good precision, even with devices having a large leakage current.

In order to solve the above-mentioned problems, the capacitance measuring device of the present invention is characterized in that it comprises a voltage source for applying voltage fluctuations to a device under test; a current source for absorbing the current flowing through the resistance component of the device under test; and an ammeter for measuring the leakage current flowing through the device under test before and after voltage fluctuations and the charging current flowing through the device under test as a result of voltage fluctuations.

The current source may be a floating current source wherein each terminal is connected to the respective terminal of the device under test.

The voltage source may have means for measuring the applied voltage for the period when charging current flows through the device under test as a result of voltage fluctuation, and further may have an arithmetic part for calculating the leakage current value when the device under test is being charged based on the current measurement result of the ammeter and the voltage measurement result of the voltage source and calculating the capacitance value of the device under test using this leakage current value.

The capacitance measuring method based on another concept of the present invention is a method for measuring the capacitance of a device under test by the step voltage method, and comprises a step whereby a voltage source applies voltage fluctuations to a device under test; a step whereby the output current value of the current source that absorbs the current flowing through the resistance component of the device under test is set at the value obtained by adding the measurement value of the leakage current one step before and the output current value of the ammeter one step before; and a step whereby an ammeter measures the leakage current flowing through the device under test before and after voltage fluctuation and the charging current flowing through the device under test as a result of voltage fluctuation.

In essence, by means of the present invention, of the currents measured by the ammeter, the majority of the leakage current flowing through the resistance component of the device under test is absorbed by the current source; therefore, only charging current and the difference between the leakage current of the step before and the leakage current of the current step flow to the ammeter. As a result, the measurement range of the ammeter can be optimized for measurement of the charging current, and an improvement of the dynamic range within which the value of the charging current is reproduced and an improvement of the S/N (signal-to-noise ratio) can be expected.

In addition, the present invention uses a floating current source wherein each terminal is connected to the respective terminal of the device under test as the current source and as a result, the potential of the electrodes operate in the same phase with regard to noise; therefore, the current source is not affected by noise and the output current is stable. As a result, the conditions under which noise is added are stabilized and the capacitance can be measured.

By means of the capacitance measuring apparatus and the capacitance measuring method of the present invention, it is possible to measure capacitance with good precision, even with devices that have a large leakage current.

DETAILED DESCRIPTION OF THE PREFERRED EMBODIMENT

Figure 1:
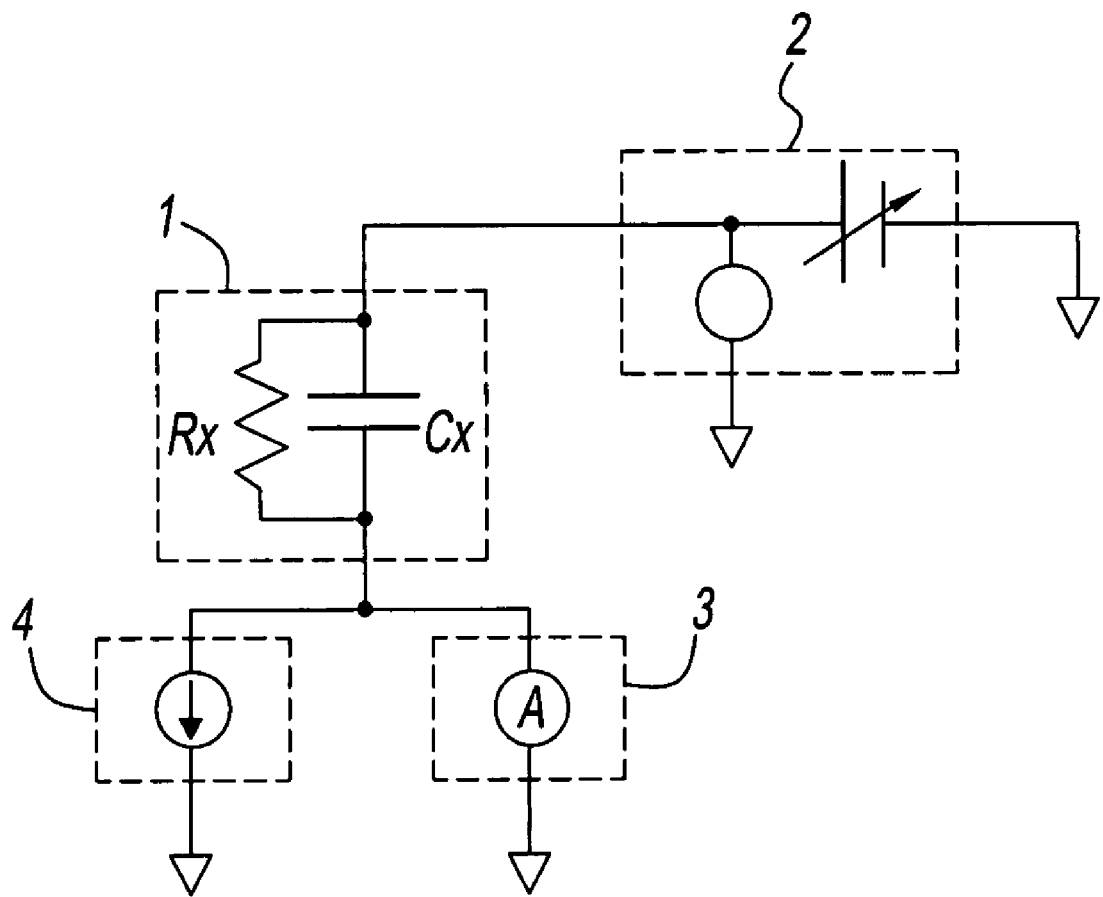
FIG. 1 is a drawing showing connections between the capacitance measuring apparatus and the device under test in an embodiment of the present invention.

Embodiments of the present invention will now be described while referring to the drawings. FIG. 1 is a drawing showing the connection between the capacitance measuring apparatus of an embodiment of the present invention and a device under test. As is shown in the same figure, this capacitance measuring apparatus comprises a first measuring unit 2 that operates as a step voltage source for applying step voltage such that voltage fluctuation is applied to device under test 1; a second measuring unit 3 that operates as an ammeter for measuring the leakage current that flows through the device under test 1 before and after voltage fluctuation and charging current that flows through device under test 1 when voltage fluctuates; and a third measuring unit 4 that operates as a current source for absorbing current that flows through resistance component Rx of device under test 1. Cx is the capacitance component of device under test 1, and Rx is the resistance component of device under test 1. Device under test 1 has a plurality of connection terminals. First measuring unit 2 is connected to one of the plurality of connection terminals of device under test 1, and second measuring unit 3 and third measuring unit 4 are connected to the other connection terminal.

Figure 2:
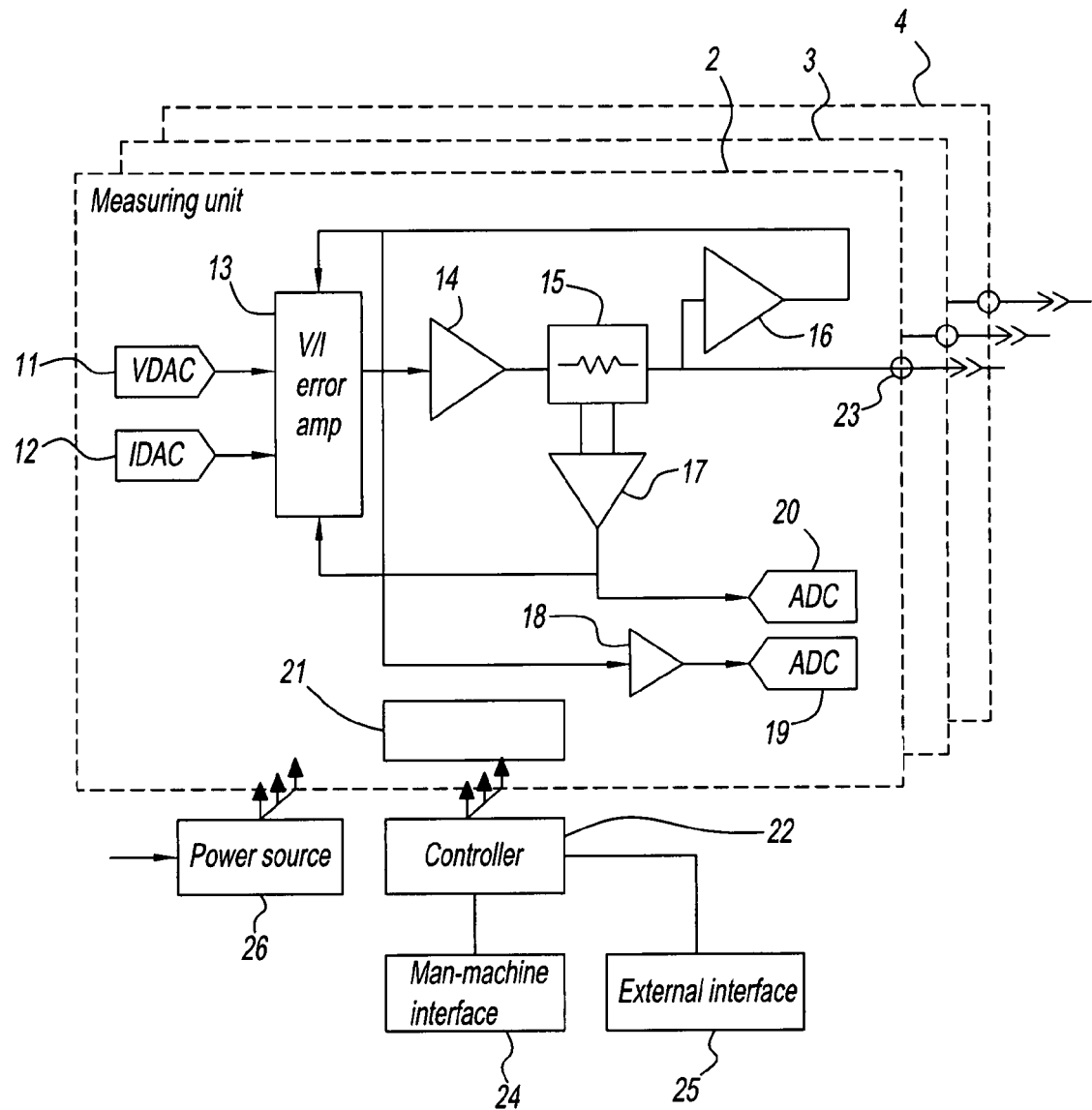
FIG. 2 is a drawing showing the structure of the first measuring unit and the second measuring unit in FIG. 1.

FIG. 2 is a drawing showing the structure of first measuring unit 2, second measuring unit 3, and third measuring unit 4. Each of first measuring unit 2, second measuring unit 3, and third measuring unit 4 has the same hardware structure. FIG. 2 shows the structure of just one of first measuring unit 2, second measuring unit 3, and third measuring unit 4.

First measuring unit 2, second measuring unit 3, and third measuring unit 4 comprise a VDAC (voltage value digital/analog converter) 11, an IDAC (current value digital/analog converter) 12, a V/I error amp 13, a power amp 14, a current monitor circuit 15, a VM (Voltage Measure) buffer amp 16, a current monitor amp 17, a voltage monitor amp 18, two ADCs (analog-to-digital converters) 19 and 20, and a control logic part 21.

VDAC 11 converts the digital voltage value, which is obtained from a controller 22 through control logic part 21, to an analog value and outputs the analog value to V/I error amp 13. IDAC 12 converts the digital current value, which is obtained from controller 22 through control logic part 21, to an analog value and outputs the analog value to V/I error amp 13.

V/I error amp 13 takes the difference between the voltage value output from VDAC 11 and the output of VM buffer amp 16 under a VLoop state, in essence, a state where the output voltage equals the voltage value setting, and controls power amp 14 such that the voltage setting value is output to a connection terminal 23 of device under test 1. Moreover, V/I error amp 13 obtains the difference between the current value output from IDAC 12 and the output of the current monitor amp 17 in a non-VLoop state, in essence, a state wherein the output voltage is not equal to the voltage value setting, and controls power amp 14 such that the current setting is output to connection terminal 23 of the device under test 1.

Power amp 14 controls the voltage or current output to connection terminal 23 of device under test 1 based on the output of V/I error amp 13. Current monitor circuit 15 is the circuit for monitoring current that flows to device under test 1. This current monitor circuit 15 has the function of switching current sensitivity (current range) in accordance with the current flowing to device under test 1.

VM buffer amp 16 monitors the voltage of connection terminal 23 of device under test 1. Current monitor amp 17 is an amp normalized such that the current value measured by current monitor circuit 15 can be subjected to A/D conversion. Voltage monitor amp 18 is an amp normalized such that the voltage measured by VM buffer amp 16 can be subjected to A/D conversion.

One ADC, 19, of the two ADCs 19 and 20 is a circuit for converting the analog voltage value normalized by voltage monitor amp 18 to the digital voltage value. The other ADC 20 is a circuit for converting the analog current value normalized by current monitor amp 17 to the digital current value.

Control logic part 21 is the logic circuit for processing control commands from controller 22. Control logic part 21 controls by transmitting, for instance, the voltage value setting for VDAC 11, the current value setting for IDAC 12, etc., and the output of the two ADCs 19 and 20 to controller 22, etc.

By having the above-mentioned structure, first measuring unit 2 operates as a voltage source having a function for restricting current, a function for setting the voltage value applied to the device under test 1, and a function for measuring the applied voltage; second measuring unit 3 operates as an ammeter for measuring the charging current of device under test 1; and the third measuring unit 4 operates as a current source capable of setting the power value.

Controller 22 comprises a CPU (central processing unit), ROM (read only memory), RAM (random access memory), an input-output part, etc. The ROM houses firmware such as programs and various parameter information that are the means for processing capacitance measurements by the step voltage method. Controller 22 is connected such that it is possible to communicate, through an input-output part, with control logic part 21 of first measuring unit 2, second measuring unit 3, and third measuring unit 4, and a man-machine interface 24 and an external interface 25. The CPU issues control commands and executes arithmetic processing for measuring the capacitance of device under test 1 based on the output of first measuring unit 2 and second measuring unit 3 in accordance with the firmware stored in the ROM, and outputs these capacitance measurement results through the input-output part to man-machine interface 24, external interface 25, etc. Moreover, the CPU sets the current value of the third measuring unit 4, which operates as a current source, in accordance with the firmware housed in the ROM.

Man-machine interface 24 is an interface for input and output with the user and, specifically, comprises a display, an input device such as a keyboard, and the like. External interface 25 is the interface for input and output with the equipment connected to the present measuring apparatus via communication cables. The connected equipment includes a memory for storing on a recording medium.

The operation of the capacitance measuring apparatus of the present embodiment will now be described.

Figure 3:
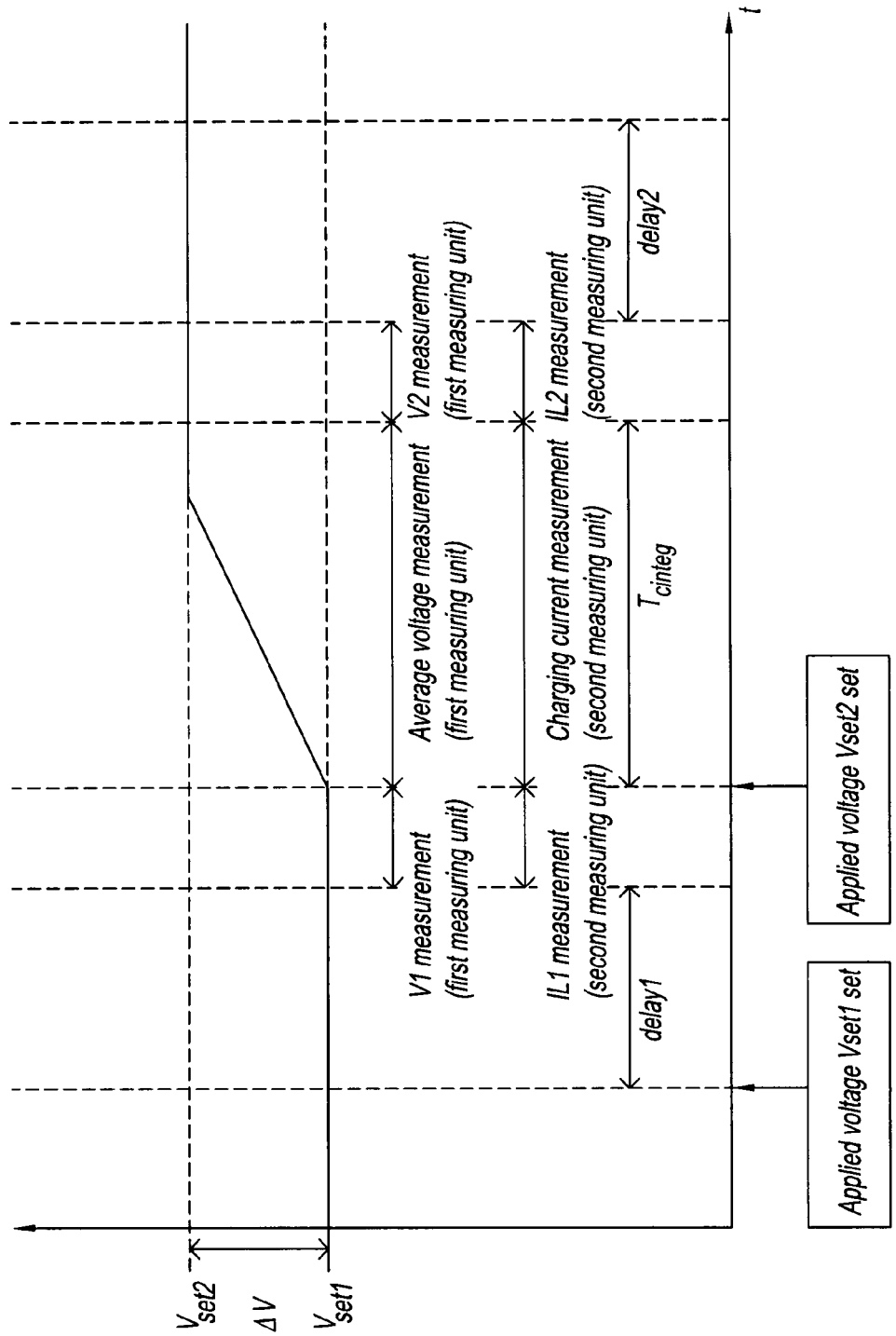
FIG. 3 is the capacitance measuring sequence of the capacitance measuring apparatus of the present invention.

FIG. 3 is the sequence of capacitance measurement by the capacitance measuring apparatus of the present embodiment, and shows changes in the applied voltage of one measurement step. This capacitance measuring apparatus measures the capacitance value for one measuring step by measuring the applied voltage, the leakage current flowing to device under test 1 before and after voltage fluctuation, and the charging current flowing through device under test 1 at the time of voltage fluctuation, and repeats this measuring step n number of times while changing the applied voltage setting. For instance, the capacitance measuring apparatus sweeps applied voltage of the voltage source every 0.1 V, from 0 V to 10 V. In this case, measurement every voltage fluctuation of 0.1 V is repeated n (=100) times.

Figure 4:
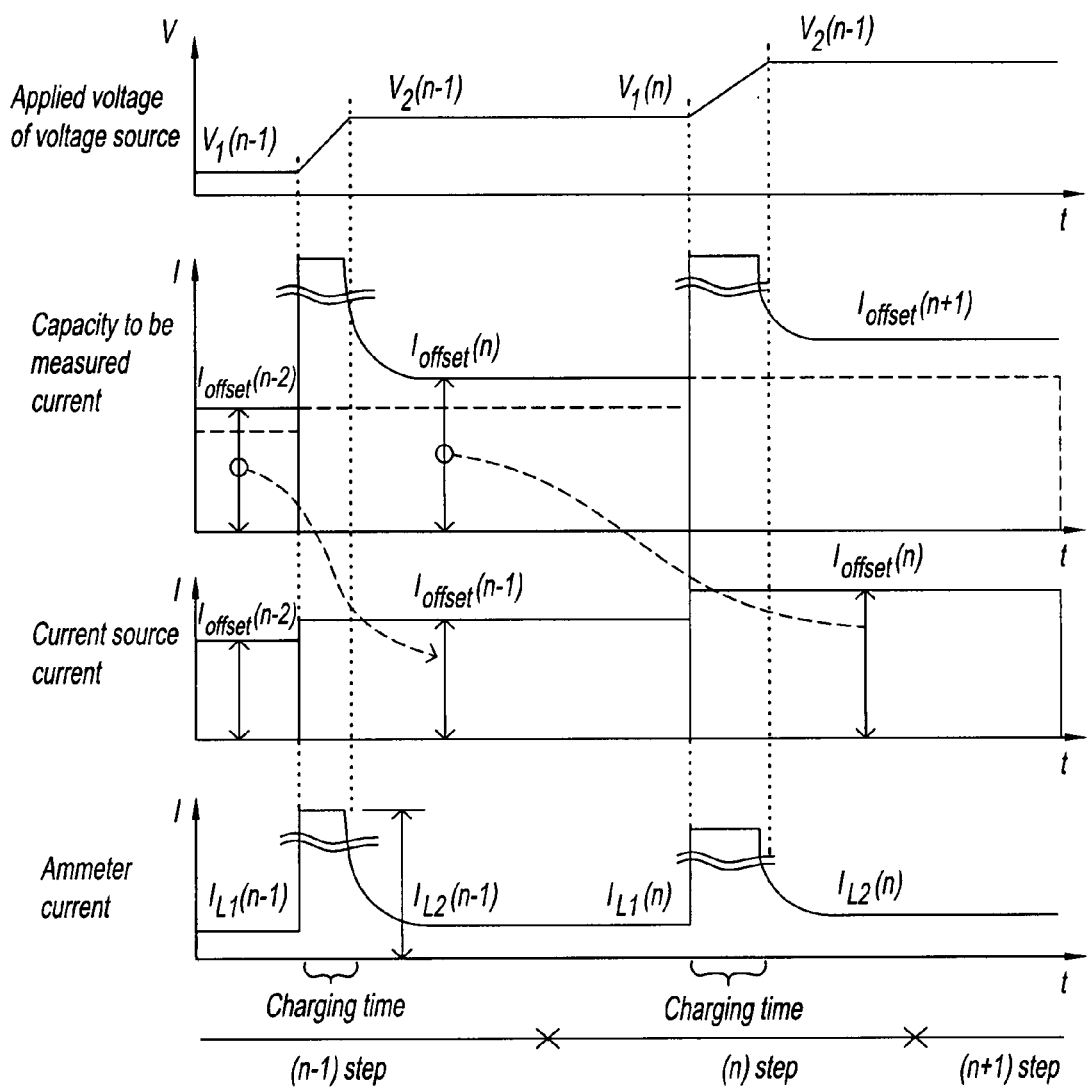
FIG. 4 is a drawing showing the relationship between the applied voltage of the voltage source, the current flowing to the device under test, the current of the current source, and the measured current of the ammeter in the multiple continuous measurement steps.
Figure 5:
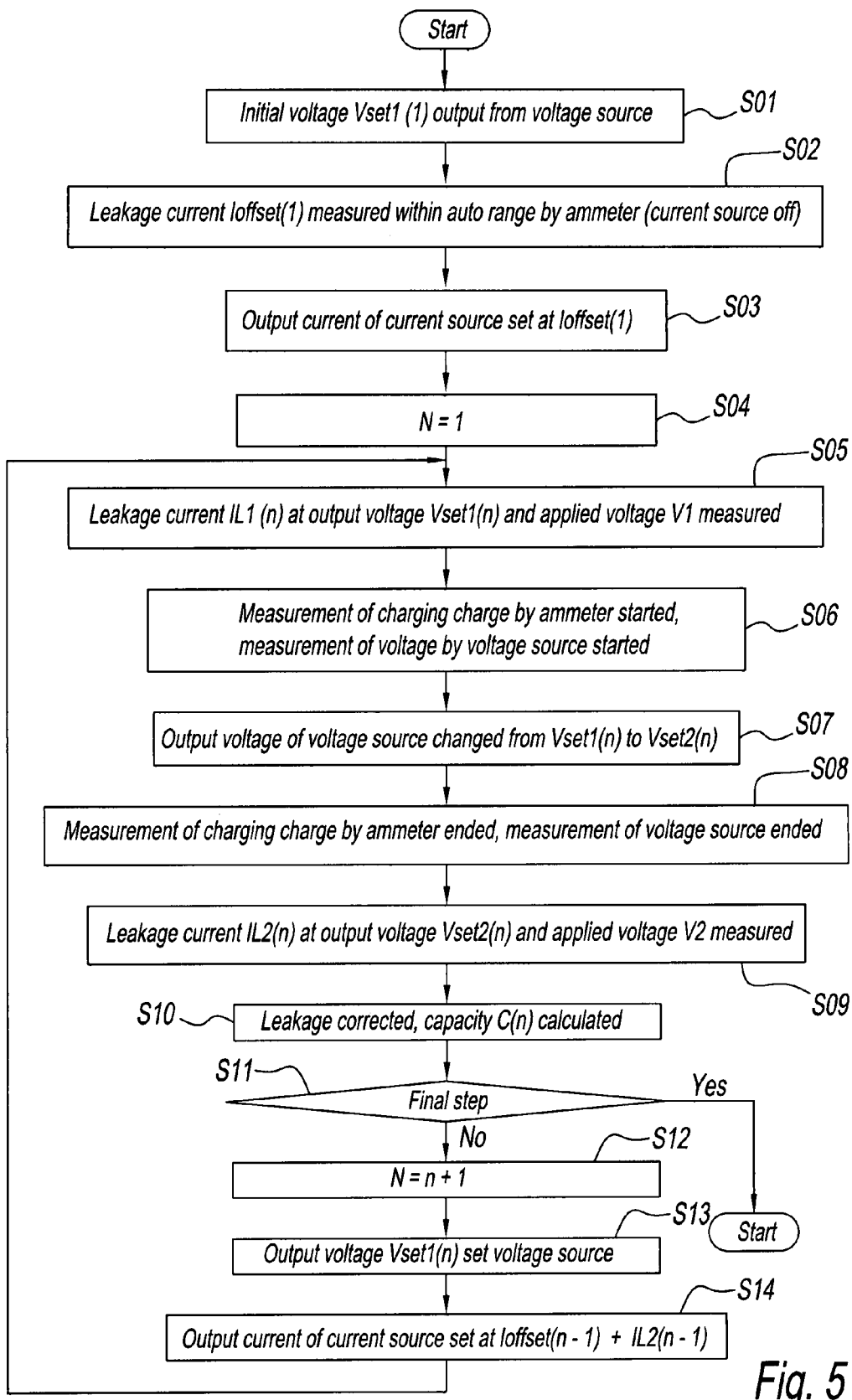
FIG. 5 is a flow chart of capacitance measurement by the capacitance measuring apparatus of the present embodiment.

FIG. 4 is a drawing showing the relationship between the applied voltage of the voltage source, the current flowing to the device under test, the current of the current source, and the measured current of the ammeter in multiple continuous measurement steps.

In the first measurement step, controller 22 sets the value of applied voltage of first measuring unit 2, which is the voltage source, at setting $V_{set}(1)$ determined as the initial value (step S01). It should be noted that in the present specification, when representing the current, the voltage, or the capacitance of a specific measurement step, the measured value of this current, voltage, or capacitance, etc. is represented together with the number of the measurement step in parentheses. Next, controller 22 leaves third measuring unit 4, which is the current source, off (current value set to 0) and causes second measuring unit 3, which is an ammeter, to measure leakage current $I_{offset}(1)$ within the automatic range (step S02). Next, controller 22 sets the value of leakage current $I_{offset}(1)$, which is the measurement result of second measuring unit 3, as the output current value of third measuring unit 4, which is the current source (step S03).

Then controller 22 sets the variable for the number of measurement steps at 1(n=1) (step S04); sets the applied voltage at setting $V_{set1}(n)$ (setting $V_{set}(1)$ in the initial step); after a specific delay time delay1 has lapsed, obtains the current value measured by second measuring unit 3 as the value of the leakage current before and after voltage fluctuations $I_{L1}(n)$; and obtains the voltage value measured by first measuring unit 2 as the value of the applied voltage before voltage fluctuations $V_{1(n)}$ (step S05). Thus, first measuring unit 2 and second measuring unit 3 have a structure wherein they are capable of independently operating and outputting measurement results such that the measurement results of first measuring unit 2 and the measurement results of second measuring unit 3 can be simultaneously obtained. It should be noted that it is not essential to the present invention that these measurements be simultaneous.

Next, controller 22 starts to obtain the voltage value measured by first measuring unit 2 as the value of the applied voltage during charging and starts to obtain the current value measured by second measuring unit 3 as the value of the charging current (step S06). At the same time, or at virtually the same time, controller 22 changes the setting of applied voltage to a predetermined different setting $V_{set2}(n)$ (step S07). The measurement of applied voltage during charging and the charging current are each continued for a predetermined time $T_{cinteg}$(step S08). This time $T_{cinteg}$ is, for instance, the value obtained by adding a margin to the time forecast until the applied voltage of the device under test reaches $V_{set2}(n)$ with respect to voltage fluctuation from $V_{set1}(n)$ to $V_{set2}(n)$.

Next, controller 22 obtains the voltage value measured by first measuring unit 2 as the value of applied voltage $V_2(n)$ after voltage fluctuation and the current value measured by second measuring unit 3 as the value of the leakage current $I_{L2}(n)$ after voltage fluctuation (step S09). Controller 22 stores the above-mentioned measurement results of first measuring unit 2 and the measurement results of second measuring unit 3 in the RAM and calculates the capacitance value C(n) of device under test 1 in accordance with the firmware housed in the ROM (step S10). Then controller 22 waits for a predetermined time delay2 to lapse and moves to the next step, in essence, operates such that the voltage setting is raised and the same measurement is performed.

Controller 22 sets the increments for the value of various numbers n of measurement steps and starts the measurement procedure of the next step (step S12). Controller 22 sets the value of the applied voltage of the first measuring unit 2, which is the voltage source, at setting $V_{set1}(n)$ of the next step (step S13). Then controller 22 sets the output current of the third measuring unit, which is the current source, at $I_{offset}(n-1)+I_{L2}(n-1)$ (step S14). In essence, the current value obtained by adding the leakage current measured by the ammeter of the step before and the output current value $I_{offset}(n-1)$ of the current source of the step before is regarded as the output current $I_{offset}(n)$ of the third measuring unit 4, which is the current source of the present step.

Then, returning to step S05, controller 22 repeats obtaining the leakage current value $I_{L1}(n)$ and the applied voltage value $V_1(n)$ before voltage fluctuation, obtaining the applied voltage value and the charging current value during charging, obtaining the leakage current value $I_{L2}(n)$ and the applied voltage value $V_2(n)$ after voltage fluctuation, and calculating the capacitance value C(n). The above-mentioned procedure is repeated up to the final step.

As a result, the majority of the current measured by second measuring unit 3, which is the ammeter, is absorbed by third measuring unit 4, which is the current source. Thus, only the charging current and the difference between the leakage current of the step before and the leakage current of the current step flow to second measuring unit 3, which is the ammeter.

The capacitance value C is found by the following formula:

$$C=\Delta Q/\Delta V=\{(I_M-I_{Leak})*T_{cinteg}+Q_{correction}\}/(V_2-V_1) \quad (7)$$

Here, $I_M$ is the charging current value measured during $T_{cinteg}$ time by second measuring unit 3, $I_{Leak}$ is the leakage current during charging, $T_{cinteg}$ is the integration period of measuring the charging current, and $Q_{correction}$ is the charge applied to the capacitance (not shown in FIG. 2) connected to the range resistance in parallel inside second measuring unit 3. The leakage current $I_{Leak}$ during charging is found from the following formula using the average value of the applied voltage, $V_{avrg}$, with this average $V_{avrg}$ being found from the applied voltage that was simultaneously measured during the measurement of the charging current.

$$I_{Leak}=I_{L1}+(I_{L2}-I_{L1})*(V_{avrg}-V_1)/(V_2-V_1) \quad (8)$$

$V_1$ is the output voltage of first measuring unit 2 before voltage fluctuation, $V_2$ is the output voltage of first measuring unit 2 after voltage fluctuation, $I_{L1}$ is the leakage current measured by second measuring unit 3 before voltage fluctuation, and $I_{L2}$ is the leakage current measured by second measuring unit 3 after voltage fluctuation.

It should be noted that the measured applied voltages $V_1$ and $V_2$ are used to calculate capacitance C and leakage current $I_{Leak}$ in formulas (7) and (8) because the measurement resolution of the applied voltage is higher than the measurement resolution of the voltage setting. As long as the resolution of the voltage settings is sufficiently high, voltage settings $V_{set1}$ and $V_{set2}$ can also be used.

As previously described, by means of the capacitance measuring apparatus of the present embodiment, of the currents measured by second measuring unit 3, which is an ammeter, the majority of the leakage current flowing through resistance component Rx of device under test 1 is absorbed by third measuring unit 4, which is a current source; therefore, only the charging current and the difference between the leakage current of the step before and the leakage current of the current step flow to second measuring unit 3, which is an ammeter. As a result, it is possible to optimize the measurement range of second measuring unit 3, which is an ammeter, for the measurement of the charging current, and to expect an improvement in the dynamic range within which the charge current value is reproduced and an improvement of the S/N (signal-to-noise ratio).

Figure 6:
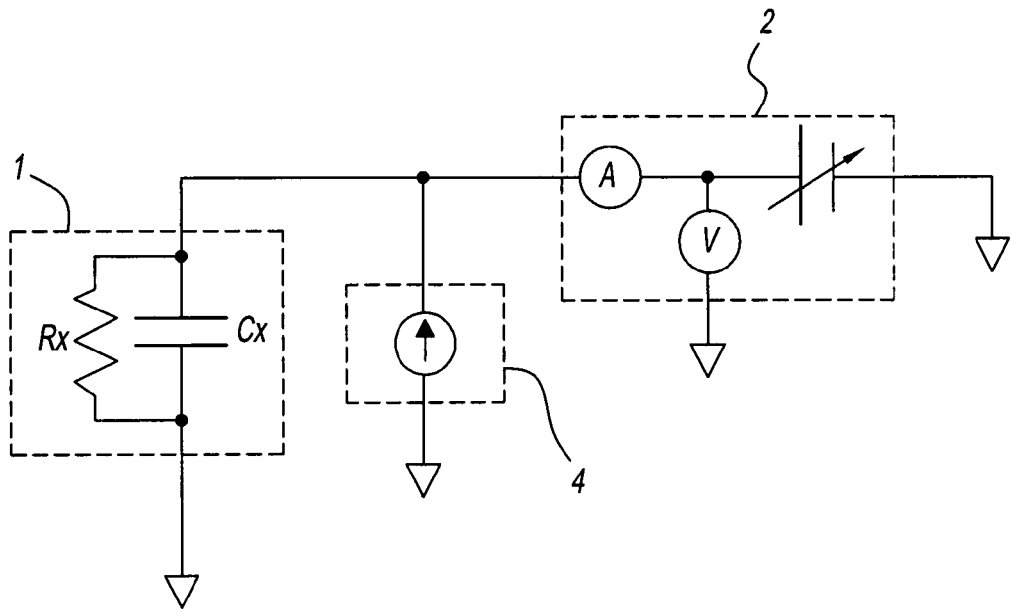
FIG. 6 is a drawing showing an example wherein each unit for capacitance measurement is connected to only one connection terminal of the device under test.

Another embodiment of the present invention will now be described. FIG. 6 is an example wherein each unit for measuring capacitance is connected to only one connection terminal of device under test 1. Moreover, the individual measuring units have the same hardware structure and can be operated as the voltage source, the ammeter, and the current source. Therefore, one measuring unit 2 is operated as the voltage source and the ammeter.

Figure 7:
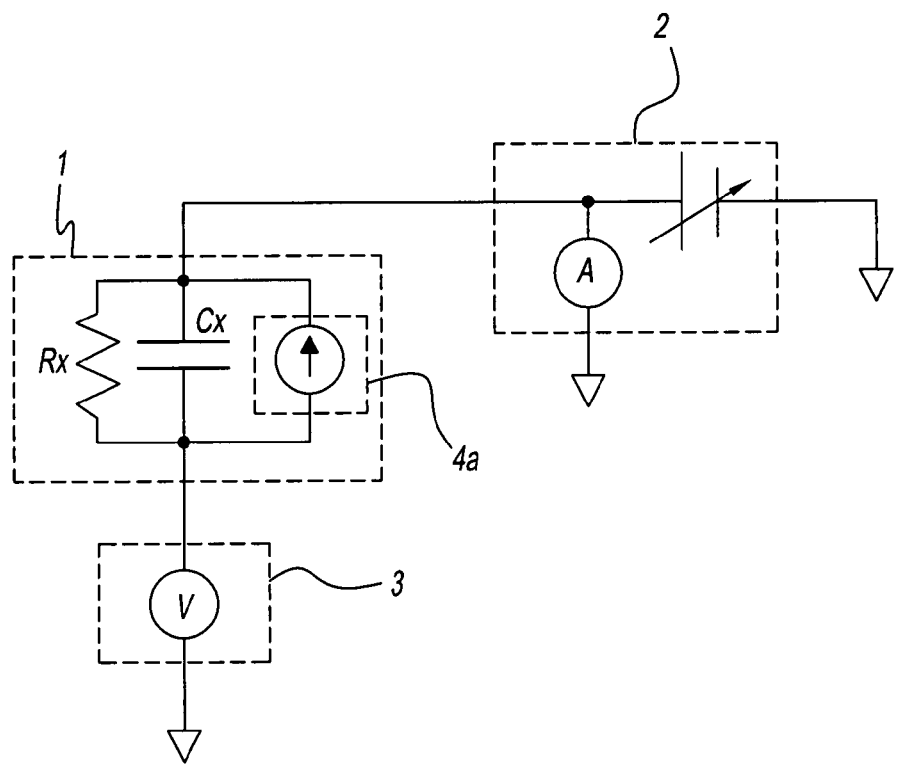
FIG. 7 is a drawing showing an example of a capacitance measuring apparatus that uses a floating current source as the current source for offset current.
Figure 8:
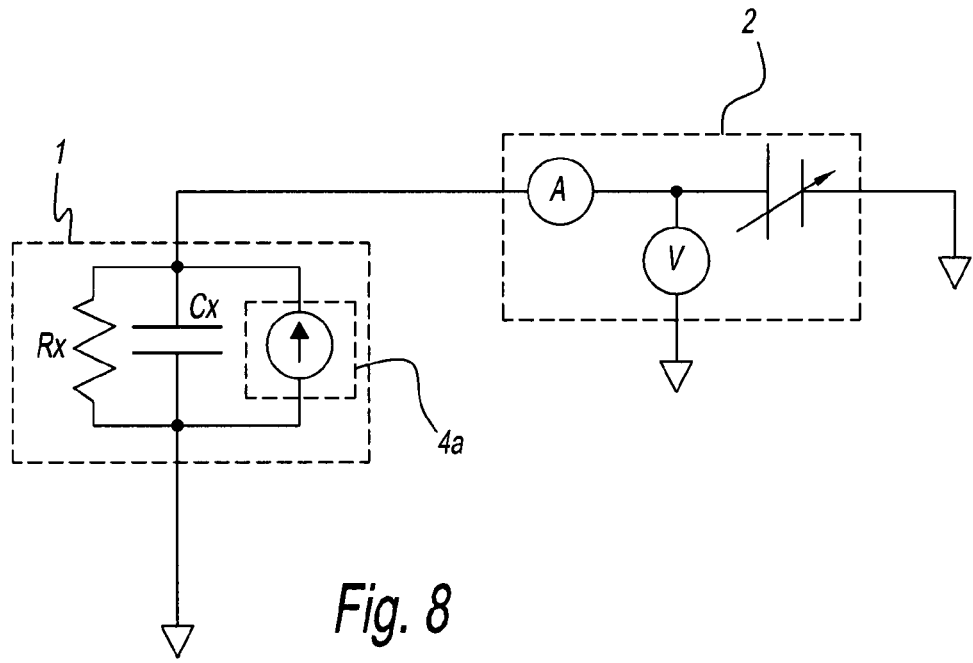
FIG. 8 is a drawing showing an example of another capacitance measuring apparatus that uses a floating current source as the current source for offset current.

FIGS. 7 and 8 show an example of the capacitance measuring apparatus wherein a floating current source 4a is connected in parallel with device under test 1 without a measuring unit as the current source for offset current. The effect of using floating current source 4a as a current source for offset current will be described.

The capacitance of device under test 1 is relatively large in comparison to the floating capacitance and the input capacitance of the measuring unit, and the potential of both terminals of device under test 1 operates in the same phase with respect to AC noise. When noise is applied to a GND system, the current value of the current source fluctuates as a result of output admittance of the current source when the current source is not floating, and this fluctuation affects the measurement values. This is because the current source in FIG. 6 operates based on the GND of a static measuring system to which noise is not applied, and therefore, the unit reacts to noise that is manifested at the connection terminal with device under test 1. In particular, by means of devices that are very small, have a thick gate oxide film, and have a large leakage current, the current to be measured (charging current) is much smaller than the current of the current source ($I_{offset}$); therefore, noise-induced fluctuations in the current ($I_{offset}$) have a large effect on the measurement values of the current to be measured (charging current). In contrast to this, by means of a structure whereby floating current source 4a is connected in parallel to device under test 1, each terminal of floating current source 4a is connected to the respective terminal of device under test 1. Therefore, the potential of both terminals with respect to noise operate in the same phase and as a result, the current source is not affected by noise and the output current ($I_{offset}$) is stabilized. In essence, floating current source 4a is affected not by the noise itself, but only by the potential difference between the two electrodes of device under test 1 that is induced by noise; therefore, there is very little effect on the measurements.

Figure 9:
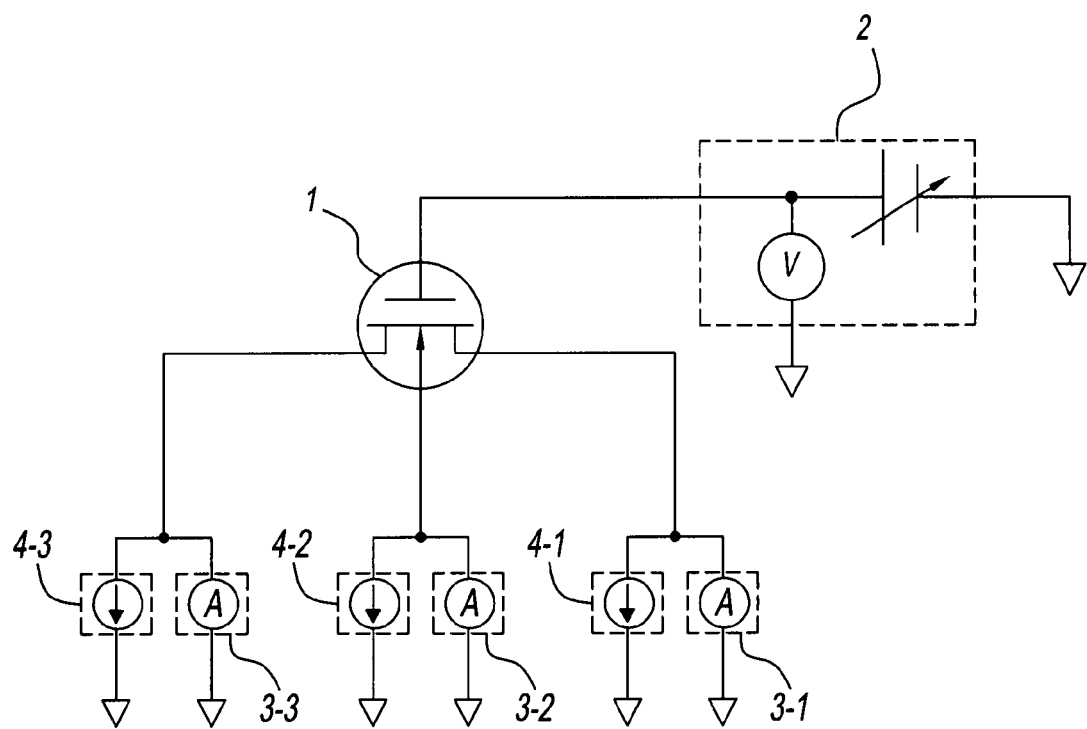
FIG. 9 is a drawing showing the structure of a capacitance measuring apparatus when a four-terminal MOSFET is used as the device under test.
Figure 10:
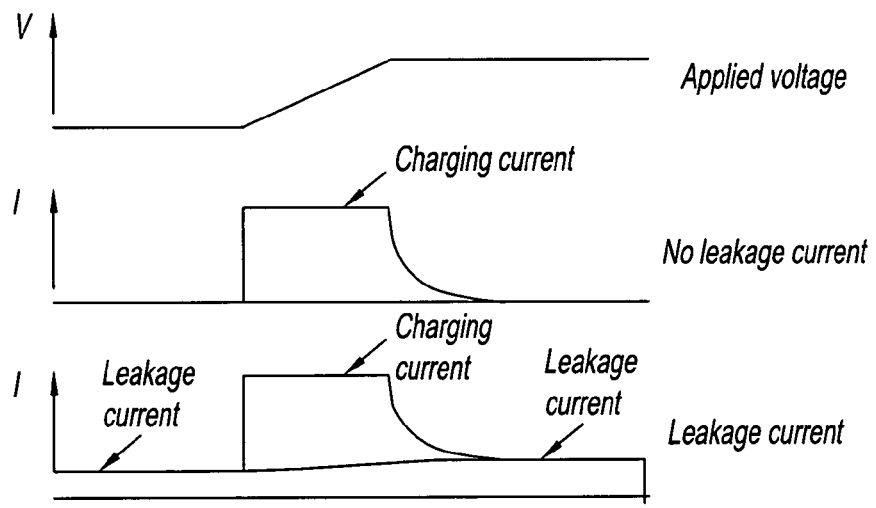
FIG. 10 is a drawing showing the effect of leakage current on the charging current of a device under test.
Figure 11:
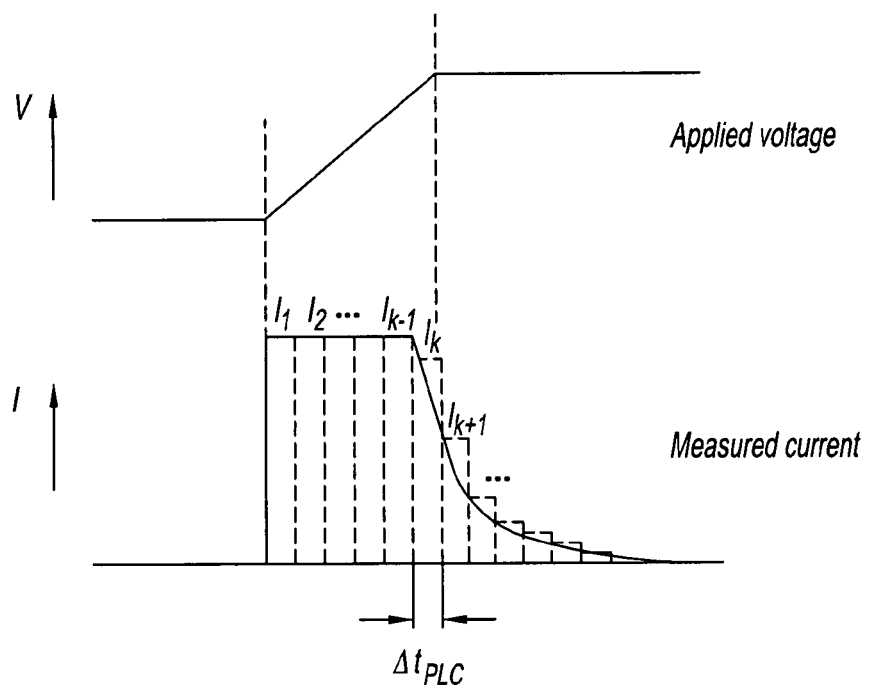
FIG. 11 is a drawing showing the method for measuring the amount of change in the charging charge.
Figure 12:
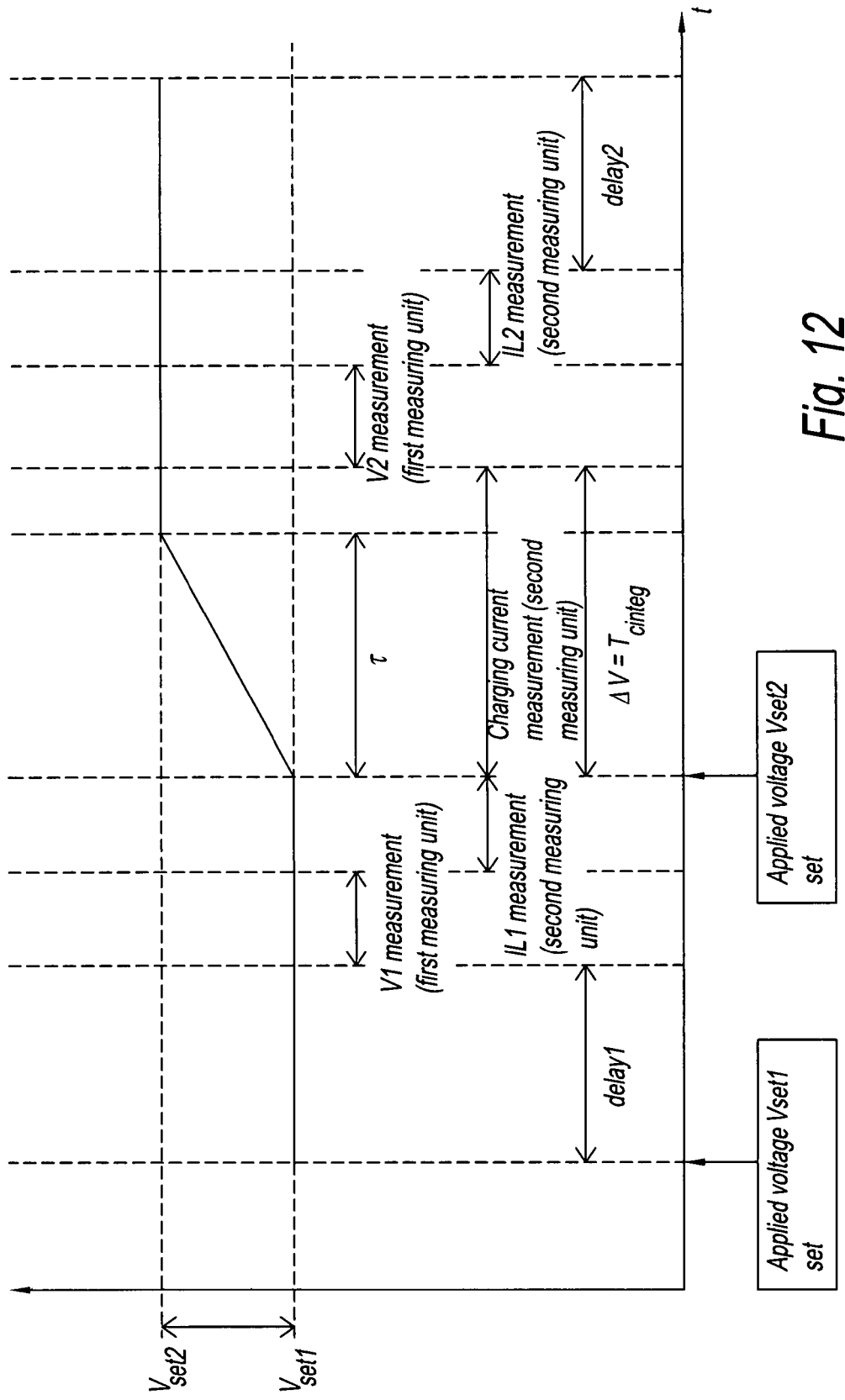
FIG. 12 is a drawing showing the measurement sequence by the conventional step voltage method.
Figure 13:
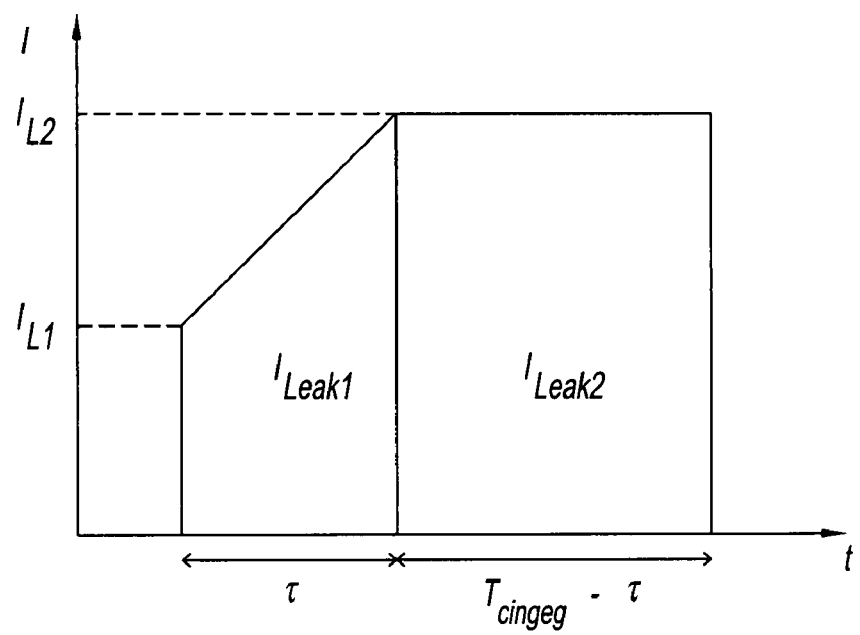
FIG. 13 is a drawing showing the change in the leakage current as estimated by the measuring method in FIG. 12.
Figure 14:
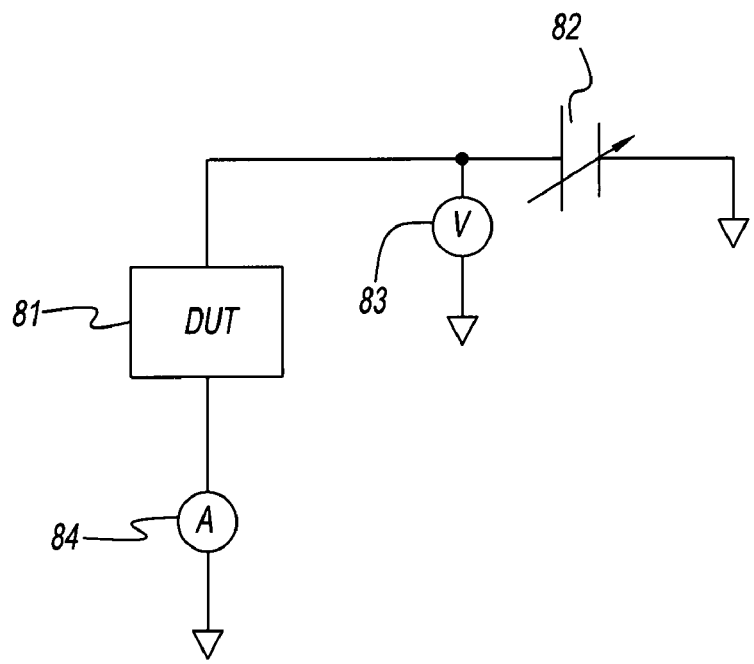
FIG. 14 is a drawing showing the block diagram of the measuring method in FIG. 12.

FIG. 9 is an example of a capacitance measuring apparatus when device under test 1 is a four-terminal MOSFET (metal-oxide-semiconductor field-effect transistor). In this case, second measuring units 3-1, 3-2, and 3-3, which are ammeters, and third measuring units 4-1, 4-2, and 4-3, which are current sources, are connected to the respective terminals of the gate and substrate, source, and drain of the MOSFET. The majority of leakage current attributed to the resistance component of each terminal of the MOSFET gate and substrate, source, and drain is absorbed by means of third measuring units 4-1, 4-2, and 4-3, which are current sources. As a result, the charging current can be measured with high precision by second measuring units 3-1, 3-2, and 3-3, which are ammeters, and the capacitance can be measured with good precision.

It should be noted that the present invention is in no way limited to the above-mentioned embodiments and a variety of modifications can be added as long as they are within a range that does not violate the essential points of the present invention. For instance, by means of the above-mentioned embodiments, each measuring unit had two ADCs 19 and 20, but the present invention is not limited to this, and it is possible to install only one ADC in each measuring unit, such that current or voltage is measured by flipping a switch. Moreover, either ADC 19 or 20 or both of these for each measuring unit can be mounted such that one is placed on a capacitance measuring apparatus other than the measuring unit, in such a way that they are connected by switching between the measuring units.

What is claimed is:

1. A capacitance measuring apparatus which comprises:
a voltage source for applying voltage fluctuation to a device under test;
an ammeter for measuring a leakage current flowing through the device under test before voltage fluctuation and the charging current flowing through the device under test as a result of voltage fluctuation; and
a current source for absorbing the leakage current so that the leakage current does not flow through the ammeter during voltage fluctuation.

2. The capacitance measuring apparatus according to claim 1, wherein said current source is a floating current source wherein each terminal is connected to the respective terminal of the device under test.

3. The capacitance measuring apparatus according to claim 1, wherein
said voltage source has means for measuring the applied voltage of the period when charging current flows through the device under test as a result of voltage fluctuation, and
further comprises an arithmetic part for calculating the leakage current value when the device under test is being charged based on the current measurement result of the ammeter and the voltage measurement result of the voltage source and calculating the capacitance value of the device under test using this leakage current value.

4. The capacitance measuring apparatus according to claim 1, wherein
said device under test has a plurality of connection terminals;
the voltage source is connected to one of the connection terminals of the device under test; and
the current source and the ammeter are connected to the other connection terminal of the device under test.

5. The capacitance measuring apparatus according to claim 1, further comprising a voltmeter; and wherein
said device under test has a plurality of connection terminals;
the voltmeter and the voltage source are connected in parallel to one of the connection terminals of the device under test; and
the current source and the ammeter are connected in parallel to the other connection terminal of the device under test.

6. The capacitance measuring apparatus according to claim 1, further comprising a voltmeter; and wherein
said device under test has a plurality of connection terminals; the ammeter has two connection terminals and one of the connection terminals of said ammeter is connected to one of the connection terminals of the device under test;
the voltmeter and the voltage source are connected in parallel to the other connection terminals of said ammeter; and
the current source are connected to said one connection terminal of the device under test.

7. The capacitance measuring apparatus according to claim 2, further comprising a voltmeter; and wherein said device under test has a plurality of connection terminals;

the voltmeter and the voltage source are connected in parallel to one of the connection terminals of the device under test; and the ammeter is connected to the other connection terminal of the device under test.

8. The capacitance measuring apparatus according to claim 2, further comprising a voltmeter; and wherein said device under test has a plurality of connection terminals;

the ammeter has two connection terminals and one of the connection terminals of said ammeter is connected to one of the connection terminals of the device under test; and the voltmeter and the voltage source are connected in parallel to the other connection terminals of said ammeter.

9. A capacitance measuring method for measuring the capacitance of a device under test by the step voltage method, said capacitance measuring method comprises:

applying a voltage fluctuation via a voltage source to a device under test;

setting an output current value of a current source that absorbs the current flowing through a resistance component of the device under test to a value obtained by adding a measurement value of a leakage current one step before and an output current value of an ammeter one step before; and measuring the leakage current flowing through the device under test before and after voltage fluctuation via an ammeter and a charging current flowing through the device under test as a result of voltage fluctuation.

* * * * *